United States Patent
Park et al.

(10) Patent No.: US 11,048,364 B2
(45) Date of Patent: Jun. 29, 2021

(54) CAPACITIVE TOUCH PANEL AND METHOD FOR ACQUIRING CAPACITANCE VALUES

(71) Applicant: SAMSUNG ELECTRONICS CO., LTD., Suwon-si (KR)

(72) Inventors: Yong Jin Park, Seoul (KR); Min Gyu Kim, Seongnam-si (KR); Sun Kwon Kim, Yongin-si (KR); Jong Bin Moon, Suwon-si (KR); Young Kil Choi, Hwaseong-si (KR); Yoon Kyung Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/549,714

(22) Filed: Aug. 23, 2019

(65) Prior Publication Data

US 2020/0150795 A1    May 14, 2020

(30) Foreign Application Priority Data

Nov. 12, 2018 (KR) .................. 10-2018-0137950

(51) Int. Cl.
*G06F 3/044* (2006.01)
*G01R 27/26* (2006.01)

(52) U.S. Cl.
CPC ......... *G06F 3/044* (2013.01); *G01R 27/2605* (2013.01)

(58) Field of Classification Search
CPC combination set(s) only.
See application file for complete search history.

(56) References Cited

U.S. PATENT DOCUMENTS

| | | |
|---|---|---|
| 8,605,054 B2 | 12/2013 | Krenik et al. |
| 2013/0173211 A1 | 7/2013 | Hoch et al. |
| 2015/0145835 A1 | 5/2015 | Vandermeijden |
| 2015/0277618 A1 | 10/2015 | Bulea |
| 2016/0071446 A1* | 3/2016 | Miyake ............ G01R 19/0092 345/214 |
| 2016/0117049 A1* | 4/2016 | Sagawai ............ G06F 3/04166 345/174 |
| 2016/0306456 A1 | 10/2016 | Slamkul et al. |
| 2017/0131843 A1 | 5/2017 | Vandermeijden |
| 2017/0228070 A1* | 8/2017 | Roberts .............. G06F 3/0443 |
| 2017/0235415 A1* | 8/2017 | Chang ................ G06F 3/0418 345/174 |
| 2017/0364184 A1 | 12/2017 | Winerth et al. |

* cited by examiner

*Primary Examiner* — Deeprose Subedi
(74) *Attorney, Agent, or Firm* — Volentine, Whitt & Francos, PLLC

(57) ABSTRACT

A method for acquiring capacitance of a capacitive touch panel includes acquiring a selected capacitance value at a selected point among a plurality of points at which a plurality of capacitances are present, in the capacitive touch panel, determining the selected capacitance value as a reference capacitance value, and performing a multi-driving using a balanced code, and acquiring a capacitance value from at least one point among the plurality of points using the reference capacitance value.

18 Claims, 15 Drawing Sheets

$$\begin{bmatrix} +1 & +1 & & +1 & +1 & +1 & +1 \\ +1 & -1 & \cdots & +1 & -1 & +1 & +1 \\ +1 & +1 & & & & & \\ +1 & -1 & & & \vdots & & \\ \vdots & \vdots & \ddots & & & & \\ +1 & +1 & & & & & \\ +1 & -1 & \cdots & \text{N X X Hadamard} & & \\ +1 & +1 & & & & & \\ +1 & -1 & & & & & \end{bmatrix}$$

$$\underline{N \quad 0 \quad 0 \quad \cdots \quad 0}_{15}$$

$$N \begin{cases} \begin{bmatrix} C_{11} + C_{21} + \cdots + C_{N1} \\ C_{11} + C_{21} + \cdots + C_{N1} \\ C_{11} + C_{21} + \cdots + C_{N1} \\ C_{11} + C_{21} + \cdots + C_{N1} \\ \vdots \\ C_{11} + C_{21} + \cdots + C_{N1} \end{bmatrix} \end{cases} = \begin{matrix} D_{21} \\ D_{31} \\ D_{41} \\ D_{51} \\ \vdots \\ D_{N1} \end{matrix}$$

$$\overbrace{\phantom{XXXX}}^{N}$$

$$N-1 \begin{cases} \begin{bmatrix} C_{21} + \cdots + C_{N1} \\ C_{21} + \cdots + C_{N1} \\ C_{21} + \cdots + C_{N1} \\ C_{21} + \cdots + C_{N1} \\ \vdots \\ C_{21} + \cdots + C_{N1} \end{bmatrix} \end{cases} = \begin{bmatrix} D_{21} - C_{11} \\ D_{31} - C_{11} \\ D_{41} - C_{11} \\ D_{51} - C_{11} \\ \vdots \\ D_{N1} - C_{11} \end{bmatrix}$$

FIG. 9

$$\begin{bmatrix} C_{21} \\ C_{31} \\ C_{41} \\ C_{51} \\ \vdots \\ C_{N1} \end{bmatrix} = \begin{bmatrix} -1 & -1 & \cdots & -1 & -1 \\ -1 & -1 & \cdots & -1 & -1 \\ \vdots & \vdots & \ddots & \vdots & \vdots \\ -1 & -1 & \cdots & -1 & -1 \\ -1 & -1 & \cdots & -1 & -1 \end{bmatrix} \begin{bmatrix} D_{31} - C_{11} \\ D_{41} - C_{11} \\ D_{51} - C_{11} \\ \vdots \\ D_{N1} - C_{11} \end{bmatrix}$$

FIG. 11

CAPACITIVE TOUCH PANEL AND METHOD FOR ACQUIRING CAPACITANCE VALUES

CROSS-REFERENCE TO RELATED APPLICATION

This application claims priority to Korean Patent Application No. 10-2018-0137950 filed on Nov. 12, 2018 in the Korean Intellectual Property Office, the subject matter of which is hereby incorporated by reference.

BACKGROUND

1. Field

The inventive concept relates to capacitive touch panels and methods for acquiring capacitance value(s) in relation to a capacitive touch panel. More particularly, the inventive concept relates to methods for acquiring capacitance values in relation to a capacitive touch panel that are capable of minimizing the adverse effects of low ground mass (LGM) noise. The inventive concept also relates to capacitive touch panels that provide capabilities minimizing the adverse effects of LGM noise.

2. Description of Related Art

Capacitive touch panels, such as touchscreens and/or the capacitive touch sensors included in touchscreens, are widely used in contemporary electronic devices because of their ease of use. However, low ground mass (LGM) noise is a difficult issue often associated with the use of capacitive touch panels, particularly in multi-driving environments.

Touchscreens often include a display panel having a touch-sensitive surface. A user may apply a touch input to a touchscreen using a touch device (e.g., a specialized device such as a stylus or a fingertip). A capacitive touch panel may be provided proximate to a front surface of the display panel, such that a touch-sensitive surface essentially covers the visible surface of the display panel. A user may simply touch the touchscreen at a desired location with a touch device in order to provide an input to an associated computing system. Upon recognizing (or interpreting) the location of the touch region—and thus the command intended by the user's touch input—the computing system may perform an appropriate operation, function or calculation.

SUMMARY

In one aspect the inventive concept provides a method for acquiring capacitance value(s) for a capacitive touch panel capable of minimizing low ground mass (LGM) noise using a multi-driving process and a reference capacitance value.

According to an aspect of the inventive concept, a method of acquiring capacitance values for a capacitive touch panel includes; acquiring a selected capacitance value for a selected point from among a plurality of points respectively exhibiting a plurality of capacitances, determining the selected capacitance value as a reference capacitance value, and performing multi-driving using a balanced code to acquire a capacitance value from at least one point among the plurality of points using the reference capacitance value.

According to another aspect of the inventive concept, a capacitive touch panel includes a first input line to an $M^{th}$ input line as an input line for sensing a touch input, and a first output line to an $N^{th}$ output line as an output line. The capacitive touch panel also includes; a reference capacitance setting unit configured to acquire a selected capacitance value at a selected point among a plurality of points respectively exhibiting a plurality of capacitances, and to determine the selected capacitance value as a reference capacitance value, and a multi-driving execution unit configured to perform multi-driving using a balanced code to acquire a capacitance value from at least one point among the plurality of points using the reference capacitance value, wherein 'M' and 'N' are integers greater than 1.

According to another aspect of the inventive concept, a method of acquiring capacitance values for a capacitive touch panel includes; selecting a low ground mass (LGM) point exhibiting minimal LGM noise from among a plurality of points, acquiring a LGM capacitance value for the LGM point and setting the LGM capacitance value as a reference capacitance value, and performing multi-driving to acquire a capacitance value from at least one point among the plurality of points using the reference capacitance value by applying a balanced code as an input signal to the capacitive touch panel to acquire an equation having a plurality of capacitance values as variables, and applying the reference capacitance value to the equation to acquire at least one capacitance value from among the plurality of capacitance values, wherein the balanced code is a code excluding at least one row or at least one column having a non-zero sum of entries in a Hadamard matrix.

BRIEF DESCRIPTION OF DRAWINGS

The above and other aspects, features, and advantages of the present disclosure will be more clearly understood from the following detailed description, taken in conjunction with the accompanying drawings, in which:

FIG. 6 is a drawing illustrating a balanced code used in performing the multi-driving process of FIG. 4;

Figure 8:
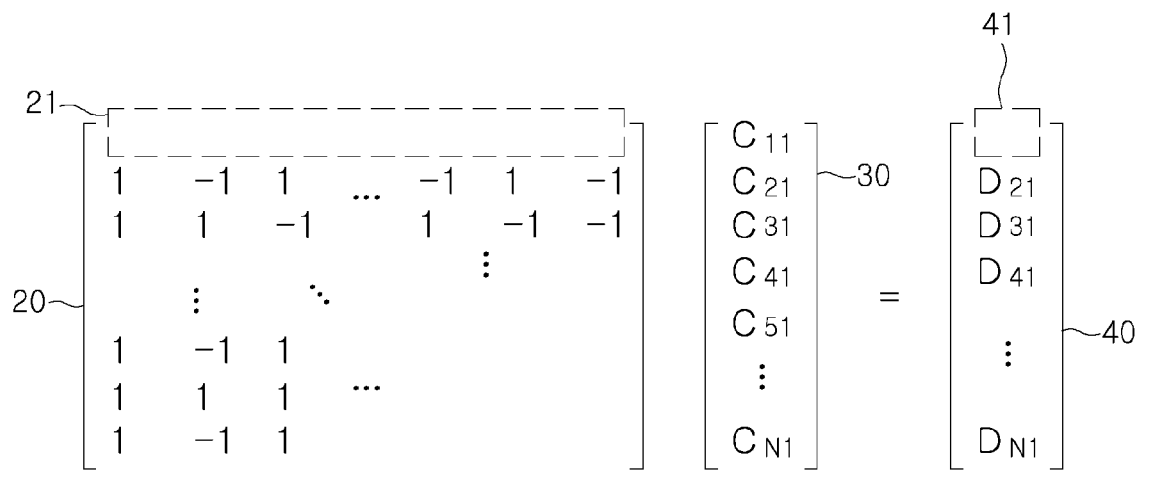

FIGS. 7, 8, 9, 10 and 11 are views illustrating various operating approaches of a method for acquiring capacitance values for a capacitive touch panel according to embodiments of the inventive concept;

DETAILED DESCRIPTION

Hereinafter, certain embodiments of the inventive concept will be described with reference to the accompanying drawings.

Various advantages and features of the inventive concept, as well as approaches for achieving the same, will become apparent with reference to the embodiments as described with reference to the accompanying drawings. The inventive concept may, however, be embodied in many different forms, and should not be construed as being limited to only the embodiments set forth herein. These embodiments may be provided such that this disclosure will be thorough and complete, and will fully convey the scope of the invention to those skilled in the art. Throughout the written description and drawings like reference numbers are used to denote like or similar elements.

Figure 1:
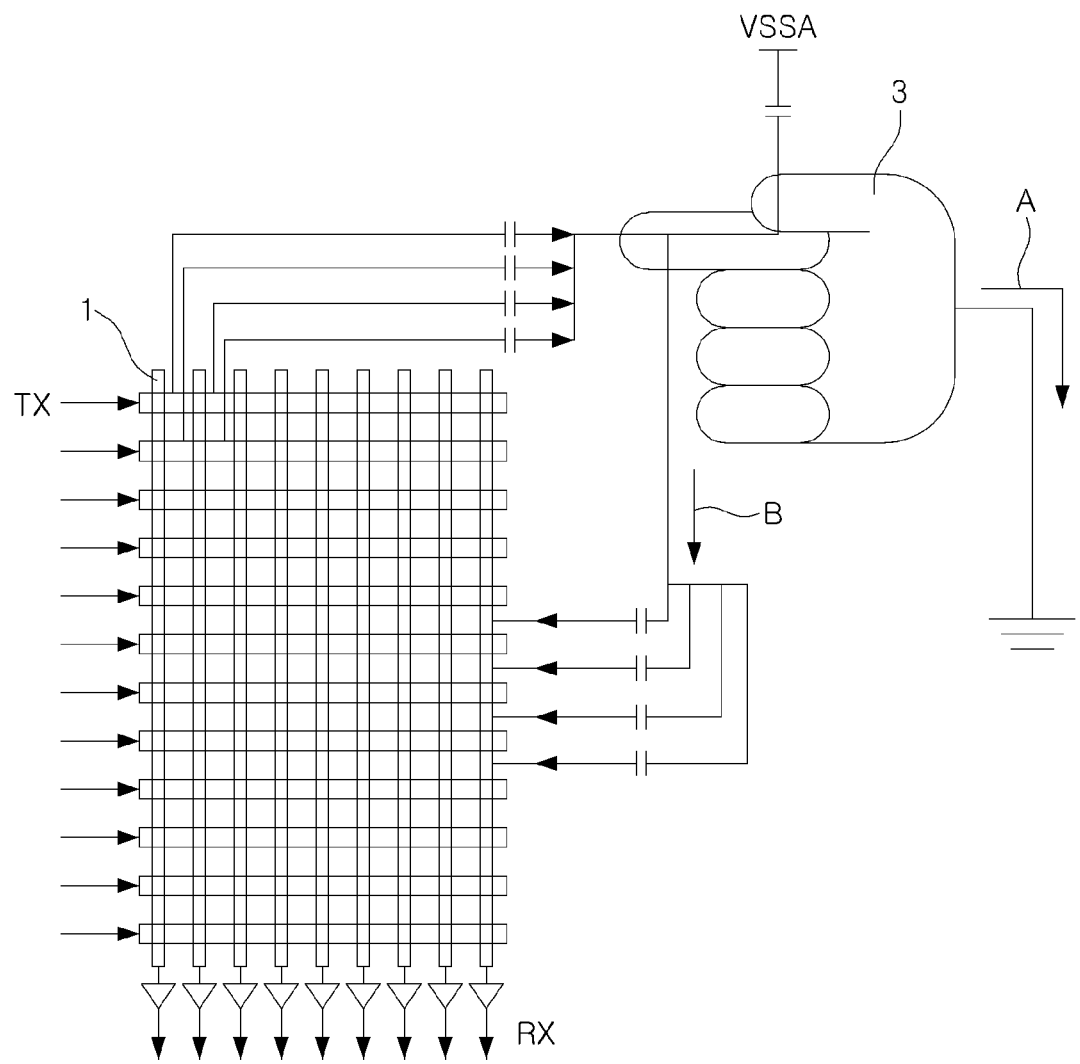
FIG. 1 is a conceptual view illustrating a user applying a touch input to a capacitive touch panel.
Figure 2:
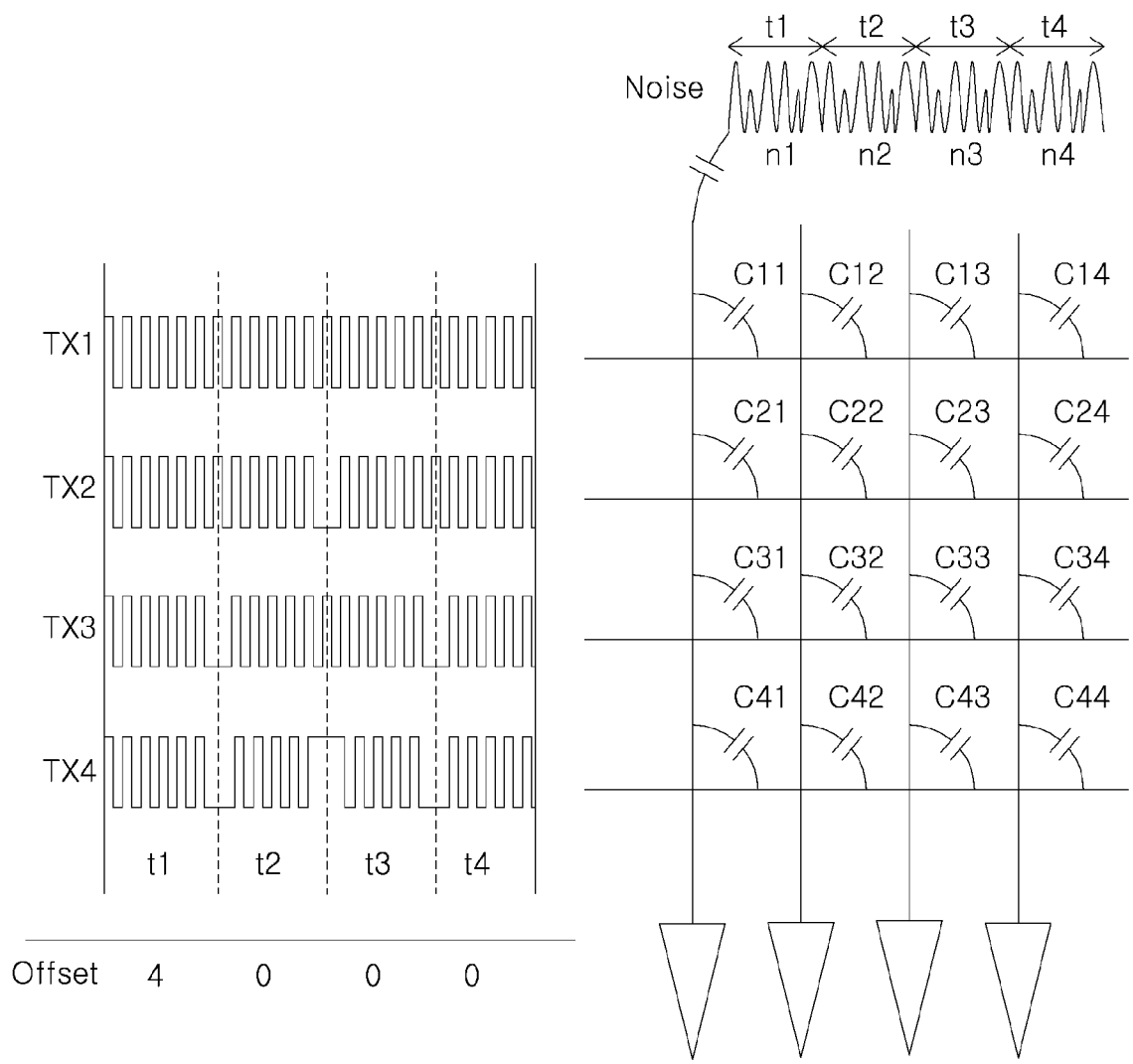
FIG. 2 is another conceptual view illustrating LGM noise that may occur in a capacitive touch panel.

FIG. 1 is a conceptual drawing illustrating a user's interaction with a capacitive touch panel; FIG. 2 is a conceptual drawing further illustrating the effect of LGM noise on a capacitive touch panel; and FIG. 3 is another conceptual drawing illustrating a sensing method that uses a Hadamard matrix in a capacitive touch panel.

Figure 3:
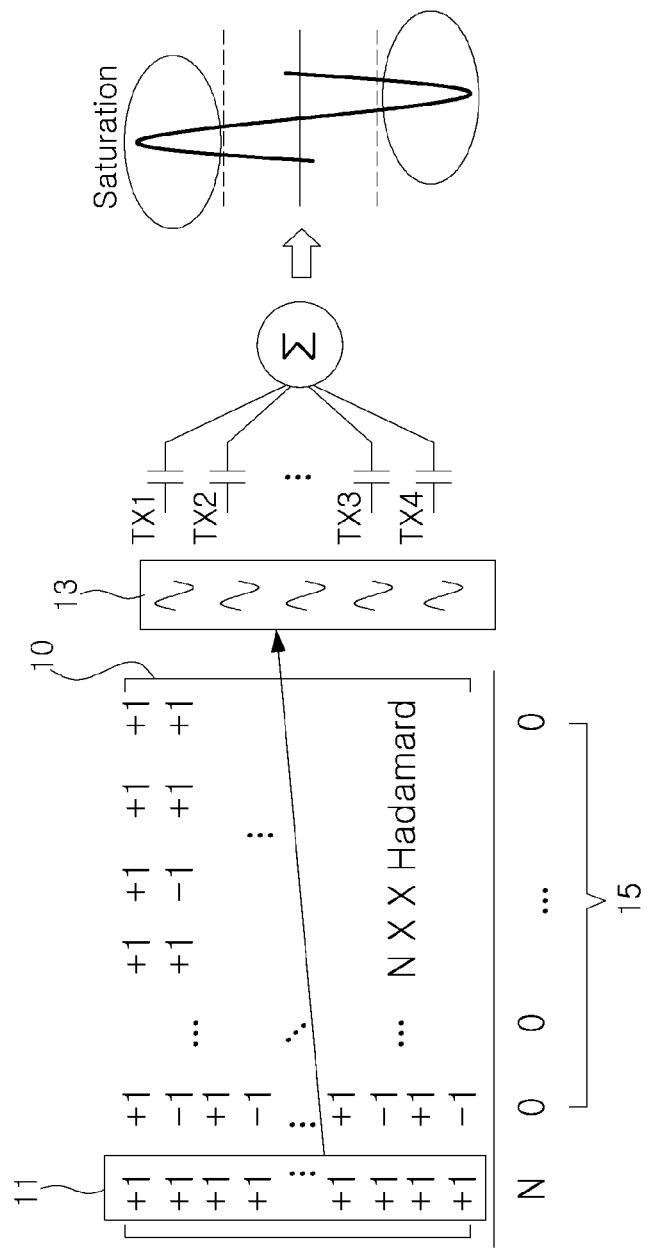
FIG. 3 is a drawing illustrating another situation that may occur in a sensing method using a Hadamard matrix in a capacitive touch panel.

Referring collectively to FIGS. 1, 2 and 3, a capacitive touch panel 1 includes fine lines that are densely arranged with a capacitance component interposed therebetween. The capacitive touch panel 1 further includes a transmitting terminal (TX) on one side that may be used to provide electric current to the lines of the capacitive touch panel 1, and a receiving terminal (RX) on another side that may be used to receive (or communicate) the electric current. Thus, when a user 3 is brought into contact with the capacitive touch panel 1, electric charge is communicated from a contacted portion (i.e., a "touch region") of the capacitive touch panel 1 and flows to ground through the user 3. Since this flow of electrical change causes a local change in a capacitance value, a capacitive touch panel may sense the location of the touch region by deriving a change in the capacitance value. In this regard, certain methods of supplying electric current to a particular line on the transmitting terminal TX may be used to sense whether or not a touch contact is present. These types of methods may be referred to as single-driving. In contrast, methods of supplying electric current to a plurality of lines on the transmitting terminal TX may be referred to as a multi-driving.

As shown in the FIG. 3, when using a multi-driving approach to the supplying of electric current to a plurality of lines in order to sense whether or not contact is present, a signal transmitted via the transmitting terminal TX may be generated using a Hadamard matrix 10. Those skilled in the art will recognize that various Hadamard type matrix(es) have been used in the communications field. A Hadamard matrix is characterized by a property that the matrix and its inverse matrix are the same as each other.

The Hadamard matrix 10 of FIG. 3 may be used to generate the signal applied to the left side of FIG. 2. Thus, a positive signal (+) output from the transmitting terminal TX at the left side of FIG. 2 may correspond to an entry represented by 1 in the Hadamard matrix 10, and a negative signal (−) therefrom may correspond to an entry represented by 0 in the Hadamard matrix 10.

In such a capacitive touch panel, an undesirable capacitance value may be generated or acquired depending on a state of the ground. This is called "low ground mass" (LGM), wherein the greater the area of the touch region (i.e., the size of the area placed in contact with the user 3), the greater the noise generated by the LGM effect (hereinafter, "LGM noise"). Hence, when the touch region is relatively large, electrical charge may not flow from the touch region through the user 3 to the ground. (See, condition A in FIG. 1). Instead, the flow of electrical charge may be towards the receiving terminal RX of the panel. (See, condition B in FIG. 1). This is one possible result of LGM noise.

Here, it should be further noted that in the Hadamard matrix 10, entries belonging to a first column and a first row may all have a value of 1. When the capacitive touch panel generates a transmission signal based on the Hadamard matrix 10, a problem may occur that LGM noise increases in proportion to a magnitude of an offset. Referring to FIG. 2, a magnitude of an offset in a t1 section among transmission signals generated based on a Hadamard matrix having 4 rows and 4 columns may be four (4), which is the sum of the entries of the corresponding column, and transmission signals generated in t2, t3, and t4 sections may have an offset value of zero (0). Since LGM noise is proportional to the magnitude of the offset, although the LGM noise generated in the t2, t3, and t4 sections in FIG. 2 may be zero (0), the LGM noise generated in the t1 section may be amplified four times, and may therefore enter the receiving terminal RX of the panel 1.

As described above, transmission signals generated based on the Hadamard matrix may continuously have entries of the same polarity and have relatively large offset values at the same time. As illustrated in FIG. 3, when the offset has the relatively high value, the signal may overload the circuit, or the signal may saturate itself.

With this background in mind, a multi-driving approach may be used to improve upon results offered by a single-driving approach which tend to be vulnerable to random noise effects. As described above, when a capacitance value is acquired by the multi-driving using the transmission signal based on the Hadamard matrix, it may be effective in the random noise, but it may not be effective in eliminating LGM noise. When a transmission signal is generated based on a matrix having an offset of all 0s, to eliminate the LGM noise in the multi-driving, still another problem may occur in that a matrix having an offset of only 0's may not derive correct results (i.e., capacitance values) due to the absence of an inverse matrix.

Figure 4:
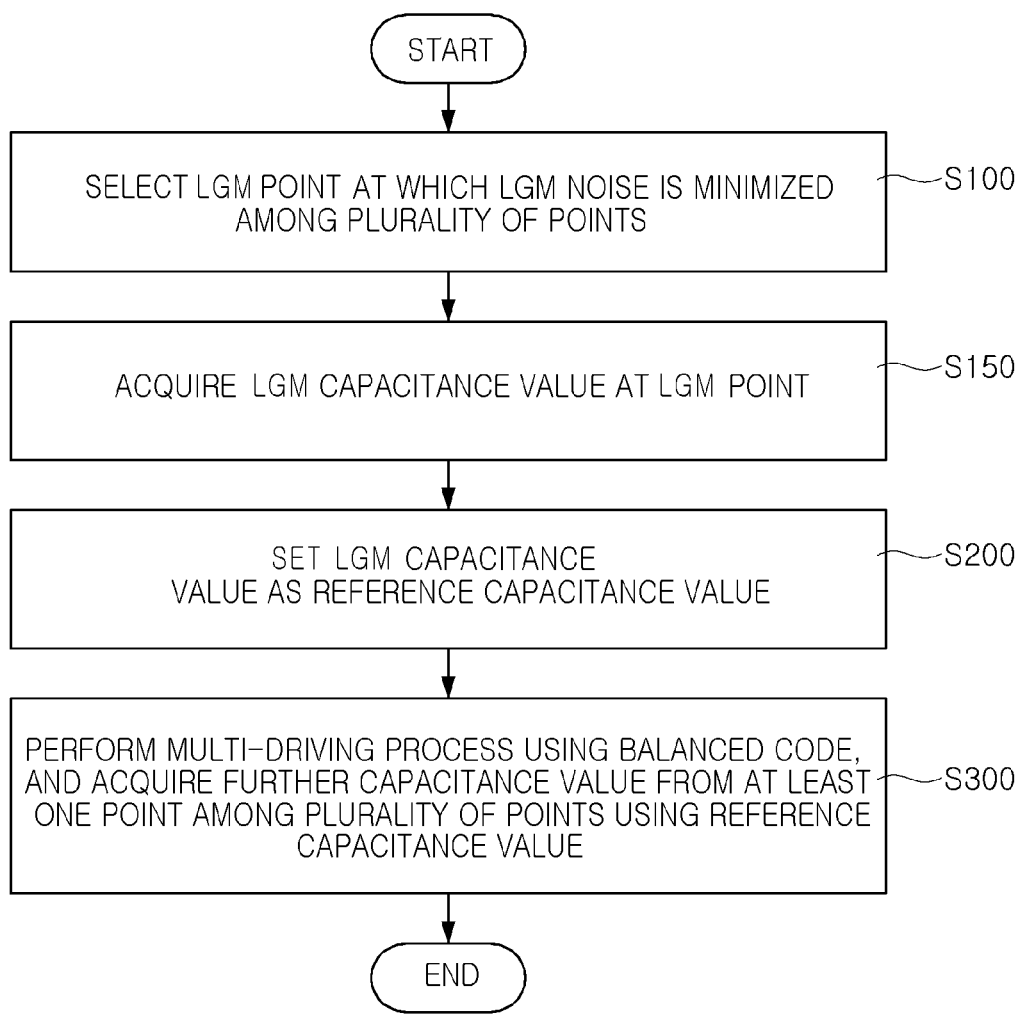
FIGS. 4 and 5 are flowcharts summarizing methods of acquiring capacitance values for a capacitive touch panel according to embodiments of the inventive concept.
Figure 5:
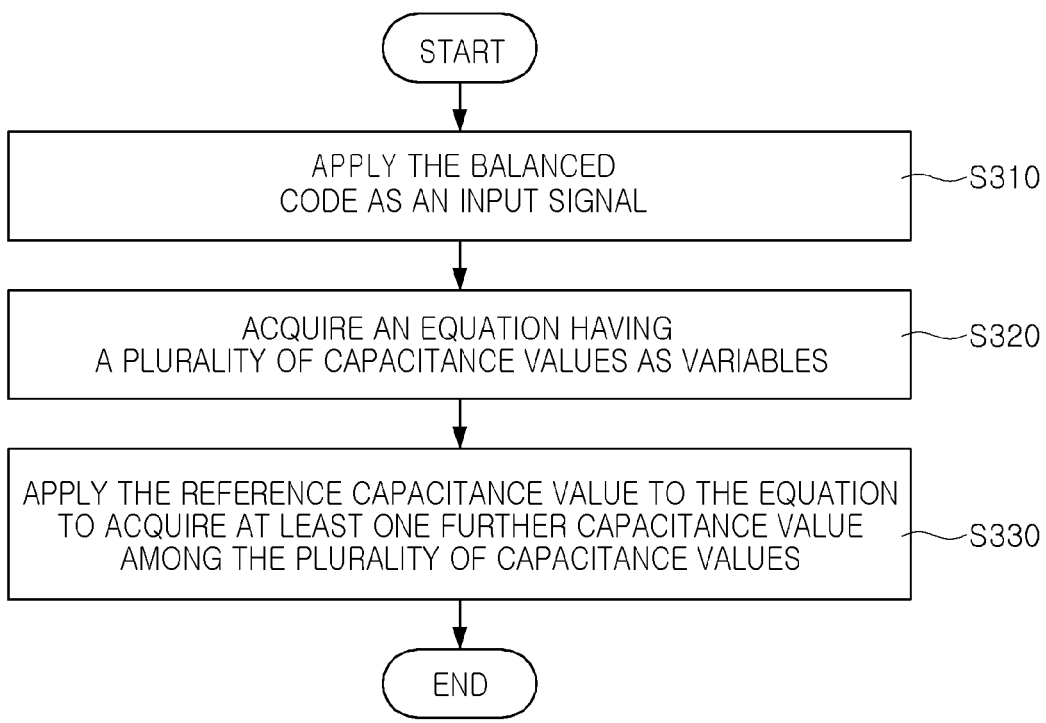

FIG. 4 is a flowchart summarizing a method for acquiring capacitance values for a capacitive touch panel according to an embodiment of the inventive concept. FIG. 5 is another flowchart further illustrating in one example an approach whereby the step S300 of FIG. 4 may be implemented.

A method for acquiring capacitance values for a capacitive touch panel according to embodiments of the inventive concept may include: (1) acquiring a selected capacitance value at a selected point among a plurality of points at which a plurality of capacitances are present; (2) determining the selected capacitance value as a reference capacitance value; and (3) performing multi-driving using a balanced code, and acquiring a capacitance value from at least one point among the plurality of points using the reference capacitance value.

In this context the term "point" is used to denote a particular location on a capacitive touch panel. At any given moment in time (or under a given set of conditions), each point may be associated with a capacitive value. In this regard the "capacitive value" detected in relation to each point may be variously determined. One or more points (e.g., a plurality of points) may be identified in relation to a capacitive touch panel in accordance with a defined capacitance condition. That is, for example, each and every location of a capacitive touch panel exhibiting a minimum capacitance value may be identified as a point. Alternately or additionally each and every location of a capacitive touch panel exhibiting a maximum capacitance, or a capacitance value residing within a bounded range of capacitive values may be identified as a point. Alternately, some or all of the points associated with a capacitive touch panel and capable of exhibiting a capacitance value may be identified as a point.

As summarized in FIG. 4, the exemplary method may include: selecting a point from among a plurality of points at which LGM noise is minimized (S100). Upon its selection, the point at which LGM noise is minimized is designated as the "LGM point". Here, each one of the plurality of points exhibits a corresponding capacitance value sufficient to be identified as a "point" within the context of the capacitive touch panel.

Once the LGM point has been designated, a capacitance value associated with the LGM point is acquired (e.g., detected or measured) and designated as a "LGM capacitance value" (S150). Thereafter, the LGM capacitance value is set as a reference capacitance value (S200).

Once the reference capacitance value has been set, the method of FIG. 4 performs a multi-driving process using a balanced code in order to acquire at least one additional capacitance value from at least one point among the plurality of points using the reference capacitance (S300). Here, an exemplary approach to obtaining a balanced code will be described in relation to FIG. 6 hereafter.

In one more particular approach illustrated in FIG. 5, the operation S300 may include: applying the balanced code as an input signal of a touch panel (S310), acquiring an equation having a plurality of capacitance values as variables (S320); and applying the reference capacitance value to the equation to acquire at least one further capacitance value among the plurality of capacitance values (S330).

Hereinafter, methods for acquiring capacitance values for a capacitive touch panel according to embodiments of the inventive concept like those described in relation to FIGS. 4 and 5 will be described with reference to FIGS. 6, 7, 8, 9, 10 and 11, where FIGS. 7 to 11, inclusive, are various drawings illustrating operating principle(s) associated with the method for acquiring capacitance values for a capacitive touch panel according to embodiments of the inventive concept.

With reference to FIG. 6, it is assumed that a Hadamard matrix having 'N' rows is used to determine a balanced code by excluding at least one row and/or column having a non-zero sum of entries. For example, since all entries included in a first column 11 of the Hadamard matrix 10 of FIG. 6 have a value of '1', a resulting offset value for the first column 11 will be 'N' (a non-zero value). Hence in the context of the assumed example of FIG. 6, a balanced code may be determined by excluding the first column 11 having a non-zero offset value from the Hadamard matrix 10. This resulting balanced code—that includes only columns having respective zero sums of entries—may be used to perform multi-driving. In this manner, when a multi-driving signal is transmitted using a balanced code, the sum of the transmitted multi-driving signals will be zero.

Figure 7:
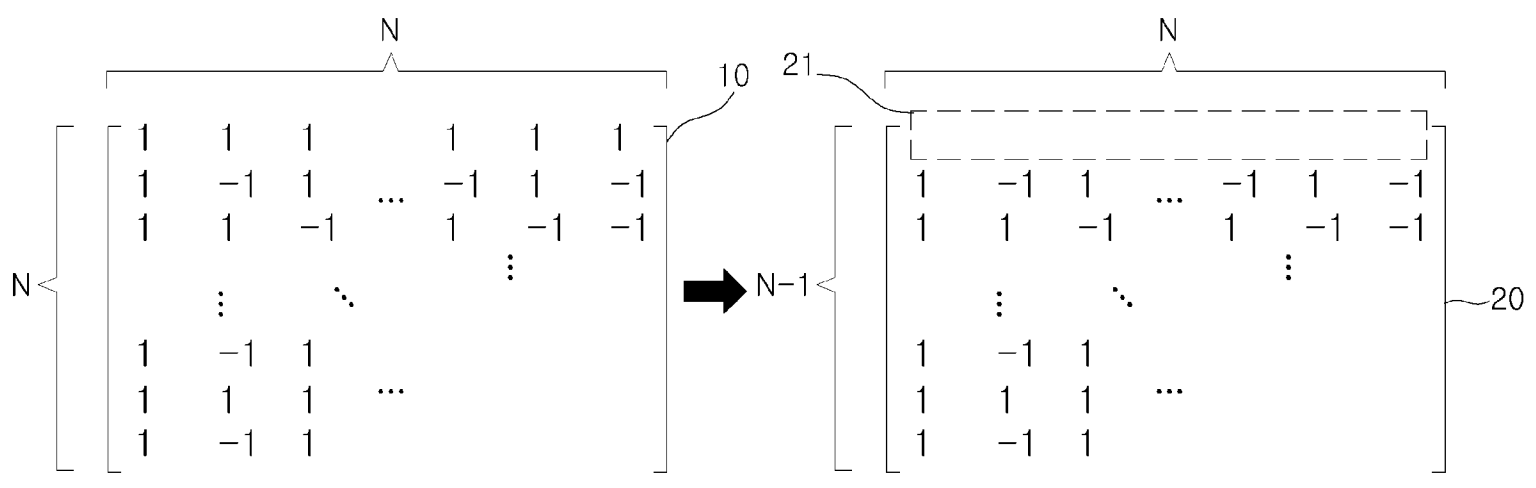

Hereinafter, an approach to acquiring a capacitance value for a capacitive touch panel according to embodiments of the inventive concept will be described under the assumption of a balanced code illustrated in FIG. 7. Referring to FIG. 7, a balanced code 20 excluding a first row 21 having a non-zero offset value from the Hadamard matrix 10 is assumed.

The balanced code 20 excludes the first row 21 having a non-zero offset value from the original Hadamard matrix 10 to a form a resulting (N−1)×N matrix. In certain methods of acquiring capacitance values for a capacitive touch panel according to embodiments of the inventive concept, a transmission signal TX may be generated to perform multi-driving based on the balanced code 20, for example. This approach may correspond to operation S310 of FIG. 5.

In certain embodiments, a balanced code applied used to acquire capacitance value(s) for capacitive touch panel may have a value of zero (0) for all of the offset values. For example, the sum of the entries belonging to each row in the (N−1)×N matrix illustrated in the right side of FIG. 7 may be zero (0). In this manner, LGM noise associated with the Hadamard matrix 10 may be minimized.

A method of deriving the capacitance value(s) through multi-driving will be described with reference to FIGS. 8 to 11, inclusive. Here, it is assumed—consistent with the assumptions of FIG. 7—that a transmission signal applied to the capacitive touch panel is sequentially constituted to start with a second row. Further, it is assumed that the transmission signal will be supplied to the transmitting terminal TX of the capacitive touch panel 1 of FIG. 1, where the transmission signal passes through capacitances 30 of the capacitive touch panel 1 in order to derived corresponding output values 40 at the receiving terminal RX.

Since under the foregoing assumptions the balanced code 20 has a structure excluding the first row 21 from the original Hadamard matrix, as illustrated in an upper portion of FIG. 9, N−1 equations may be derived instead of N equations. This approach may correspond to operation S320 of FIG. 5.

Since there are a total of N capacitance values to be acquired, it is necessary to separately derive at least one of the N capacitance values. To this end, a method of acquiring capacitance values for capacitive touch panel according to embodiments of the inventive concept may perform operations S100 and S150 of FIG. 4 which will be described in some additional detail hereafter. The following explanation of FIG. 9 will continue under an assumption that derived capacitance value is C11 is separately obtained.

Figure 10:
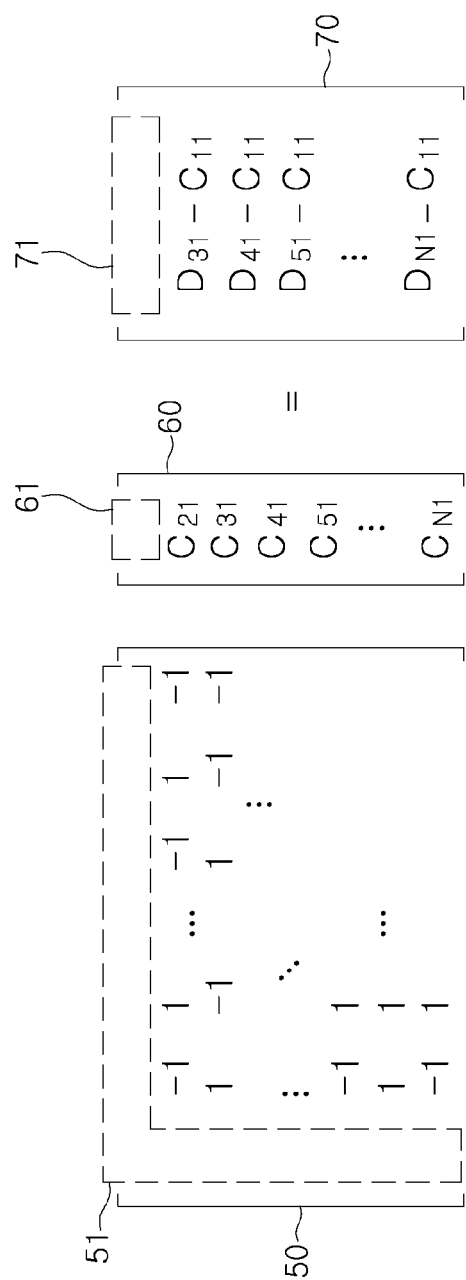

Referring to FIG. 9, when the capacitance C11, which is a variable located on the left side of the N−1 equations, is shifted to the right side as illustrated in the lower side of FIG. 9 and then converted into a matrix structure, a matrix equation may be derived as illustrated in FIG. 10. An (N−1)×(N−1) matrix 50 illustrated on the left side of FIG. 10 may be a state in which both a first row and a first column are removed, and all offset values of each row and each column are not zero. Therefore, an inverse matrix of the matrix 50 may be present as a matrix 80 of FIG. 11, and a matrix formula illustrated in FIG. 10 may be transformed into a matrix formula illustrated in FIG. 11.

Referring to FIG. 11, when a capacitance value C11 (i.e., the reference capacitance value) derived separately is known, all (N−1) capacitance values existing in the left side of the matrix equation may be acquired.

To this end, a method of acquiring capacitance values for a capacitive touch panel according to embodiments of the inventive concept may include acquiring a capacitance value at a selected point among a plurality of points at which a plurality of capacitances are present in the capacitive touch panel, before performing a multi-driving (S100, S150), and selecting a reference capacitance value (S200).

Here, a particular point identified from the capacitive touch panel may be preferable to a point at which an amount of noise, particularly of LGM noise to be generated, is relatively low. For example, there may be a point (e.g., at an outermost edge of the capacitive touch panel) at which a touch input is minimally apparent on the capacitive touch panel.

For example, in certain embodiments of the inventive concept the operation S100 of FIG. 4 may include, after a specific LGM point has been selected, it may be determined whether the selected point is an environment in which LGM noise may occur, such as whether or not a touch is generated. When the selected point is an environment in which LGM noise may occur, other points may be selected.

In operation S150 illustrated in FIG. 4, a capacitance value for the selected point may be acquired. There is no restriction on a method for acquiring a capacitance value of the selected point, such as a single-driving, a multi-driving, a self capacitance sensing method, or the like. Since a capacitance value is sufficient to be acquired, it may be acquired by a single-driving using only one transmission signal TX.

The acquired capacitance value may be selected as the reference capacitance value in operation 200 of FIG. 4, and this reference capacitance value may be applied in operation S300 of FIG. 4 (or operation S330 of FIG. 5). Therefore, at least one or both of remaining capacitance values represented by a matrix 60 in FIG. 11 may be derived.

Figure 12:
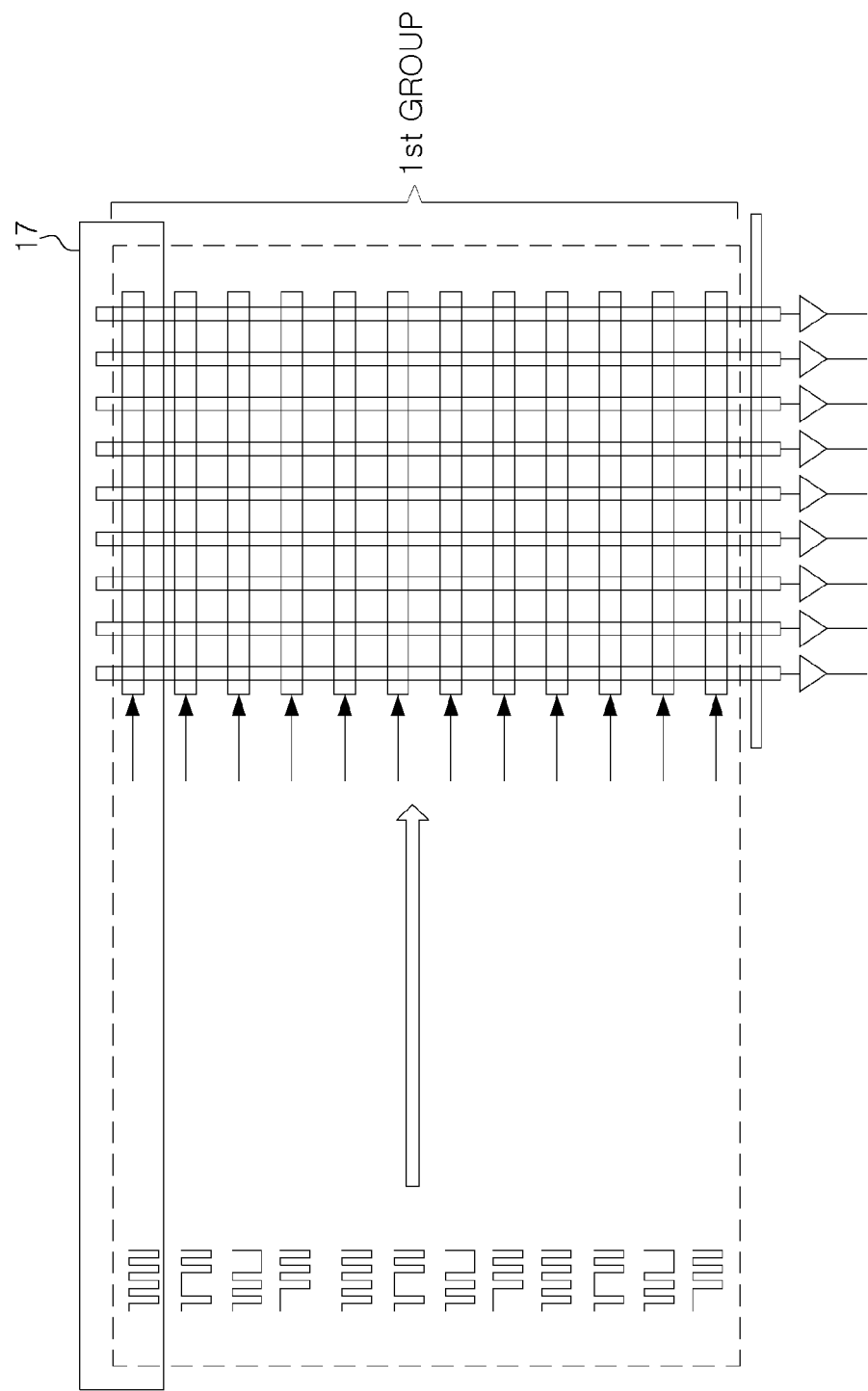
FIGS. 12, 13 and 14 are views illustrating various embodiments for performing a multi-driving process in a method for acquiring capacitance of a capacitive touch panel of the present inventive concept.
Figure 13:
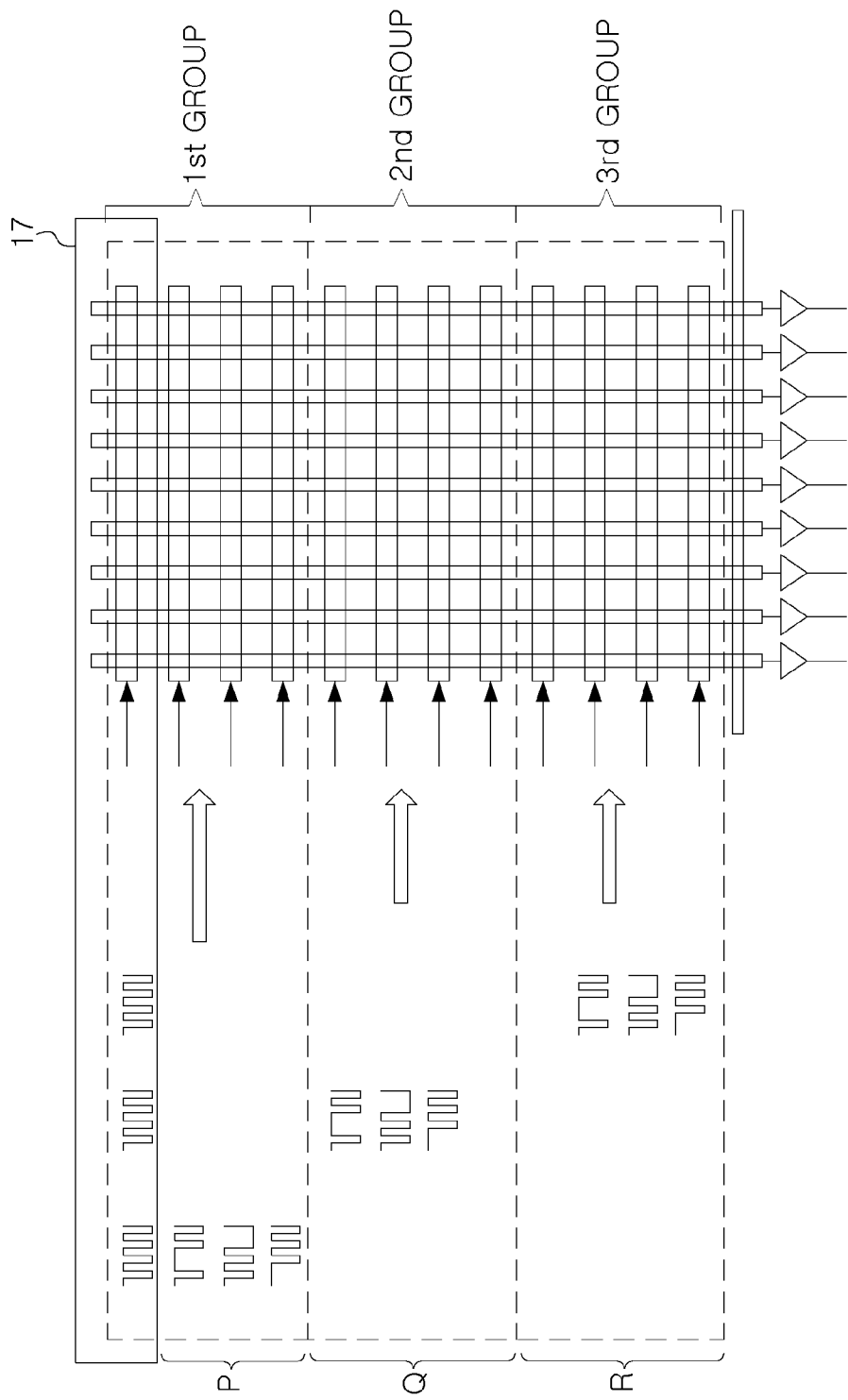
Figure 14:
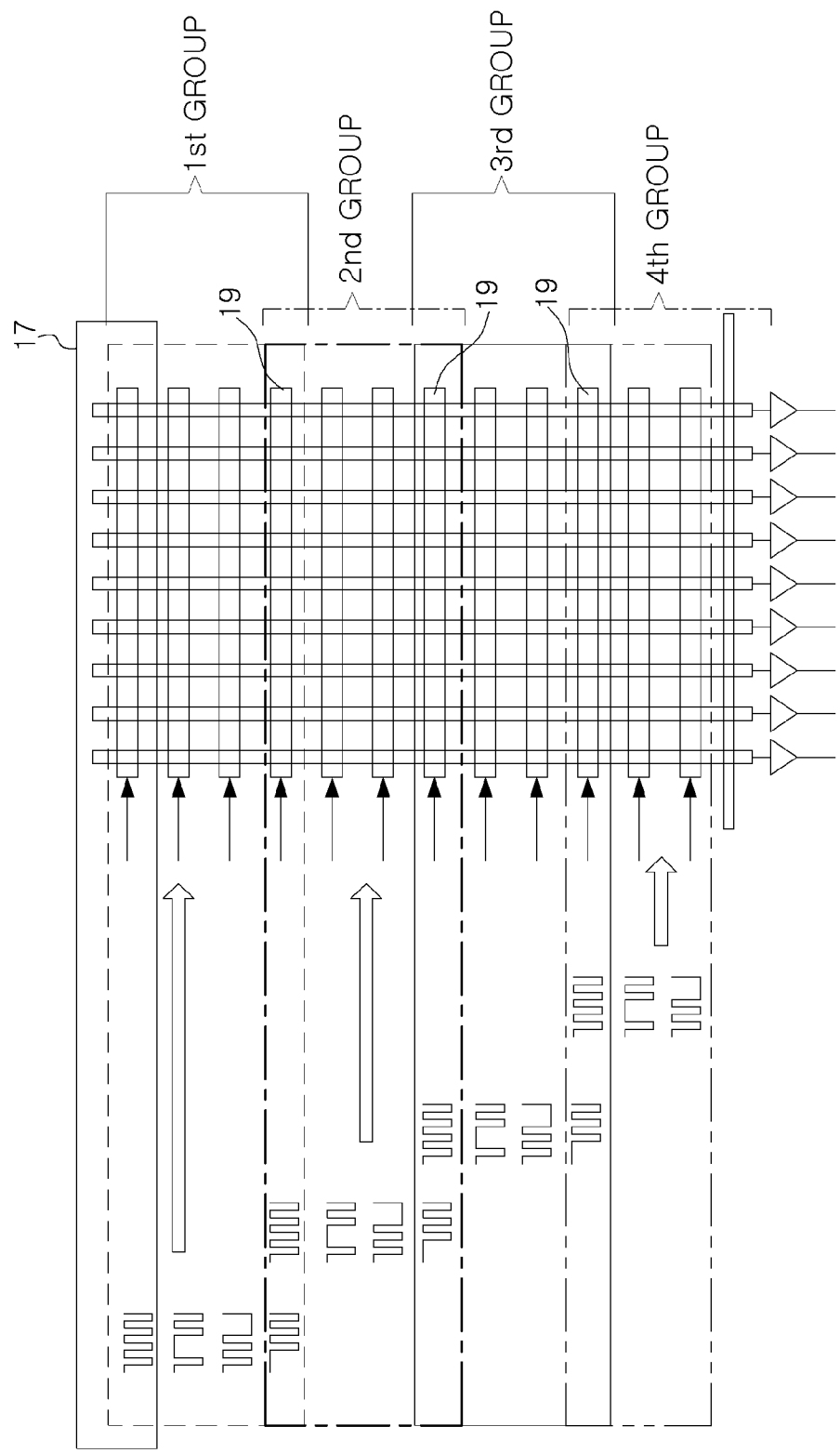

FIGS. 12, 13 and 14 are conceptual drawings further illustrating various approaches to multi-driving in a method for acquiring capacitance values for a capacitive touch panel according to embodiments of the inventive concept.

Here, it is assumed that the method of acquiring capacitance values for a capacitive touch panel according to embodiments of the inventive concept may be applied to a capacitive touch panel 1 in which an input line of the capacitive touch panel comprises a first input line through an $M^{th}$ input line, and an output line of the capacitive touch panel comprises a first output line to an $N^{th}$ output line.

In the capacitive touch panel 1 of FIGS. 12, 13 and 14, 'M' is assumed to be 12 and 'N' is assumed to be 9, but these assumptions are made only for convenience of explanation. Those skilled in the art will recognize that 'M' and 'N' may be any practical number greater than 2. Also, in certain embodiments of the inventive concept, the selected point may be respectively present in at least one line of the first through $N^{th}$ output lines, to select a reference capacitance value.

Referring to FIGS. 12, 13 and 14, an approach to performing multi-driving in certain embodiments of the inventive concept will be described in some additional detail.

As shown in FIG. 12, a reference capacitance value for at least one point of a selected line 17 is acquired, and multi-driving is performed for all (M−1) input lines at once using the acquired reference capacitance value. At this time, a balanced code applied in operation S300 of FIG. 4 (or operation S310 in FIG. 5) may be a code excluding at least one of a first row or a first column of a Hadamard matrix having 'M' rows and 'M' columns.

Alternatively, as illustrated in FIG. 13, a reference capacitance value for at least one point of the selected line 17 may be acquired, lines having an arbitrary number 'P' (e.g., greater than 1 but less than 'M') may be selected as a first group (e.g., first group in FIG. 13), and a first multi-driving may be performed on the group. Next, 'Q' lines among remaining input lines excluding the selected P lines may be selected as a second group (e.g., second group in FIG. 13), and a second multi-driving may be performed. In this way, first to $R^{th}$ multi-drivings may be performed by dividing the total 'M' input lines into a plurality of first through $R^{th}$ groups, where 'R' is an integer greater than 1. FIG. 13 illustrates an embodiment in which R=3. Here, the reference capacitance value applied at the time of performing the first to $R^{th}$ multi-drivings may be the same value.

Alternatively, as illustrated in FIG. 14, a reference capacitance value for at least one point of the line 17 may be acquired, 'P' lines having may be selected as a first group and a first multi-driving may be performed on the selected first group. Then, Q lines among remaining input lines excluding the selected P lines may be selected as a second group and a second multi-driving may be performed. In this way, first to $R^{th}$ multi-drivings may be performed by dividing the total M input lines into a plurality of first through $R^{th}$ groups, where in the specific example illustrated in FIG. 14 R=4.

Here, the reference capacitance value applied at the time of performing the second to $R^{th}$ multi-drivings may use any one of capacitance values acquired by performing the multi-driving of the previous order. FIG. 14 illustrates an embodiment in which capacitance values existing in a lowermost input lines 19 among the capacitance values acquired as a result of the multi-driving for the previous group may be used (overlapped) as a reference capacitance value at the time of performing a multi-driving for the next group.

While the scope of the inventive concept is not limited thereto, the reference capacitance value used as a reference capacitance value at the time of performing multi-driving for a next group may be sufficient to use any one of capacitance values acquired by performing multi-driving for a previous order.

Furthermore, FIGS. 13 to 14 illustrate embodiments in which a multi-driving is performed by setting neighboring input lines as a single group. The scope of the inventive concept is not limited thereto, and multi-driving may be performed by setting a plurality of input lines which are not adjacent to each other as a single group.

Figure 15:
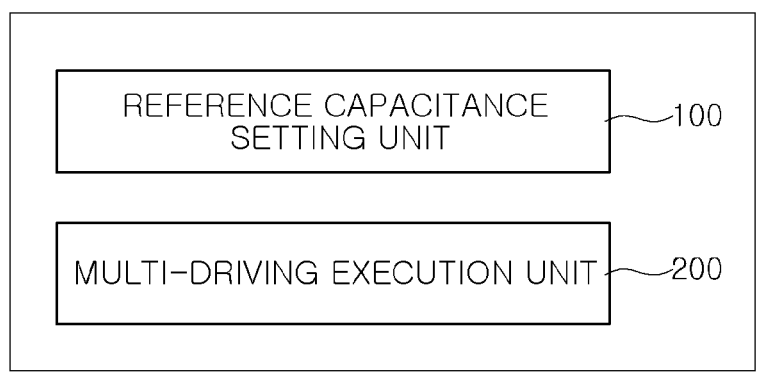
FIG. 15 is a block diagram of a capacitive touch panel according to an embodiment of the inventive concept.

FIG. 15 is a block diagram illustrating a capacitive touch panel 1A according to an embodiment of the inventive concept. The capacitive touch panel 1A may include a first input line to an $M^{th}$ input line as an input line for touch sensing, and a first output line to an $N^{th}$ output line as an output line thereof. Referring to FIG. 15, a reference capacitance setting unit 100 and a multi-driving execution unit 200 may be included.

The reference capacitance setting unit 100 may acquire a capacitance value at a selected point among a plurality of points at which a plurality of capacitances are present, and may select the acquired capacitance value as a reference capacitance value Specific details of the contents performed by the reference capacitance setting unit 100 may be referred to the description of operations S100 to S200 in FIG. 4, and a detailed description thereof will be omitted here to avoid an overlapped explanation thereof.

The multi-driving execution unit 200 may perform a multi-driving using a balanced code, and acquiring a further capacitance value from at least one point among the plurality of points using the reference capacitance value, when the multi-driving is performed. (Reference operation S300 of FIG. 4 or operations S310 to S330 of FIG. 5).

Here, the term "unit," for example, "module" or "table" used in the present embodiment may refer to software entries, and hardware entries such as a field programmable gate array (FPGA) or an application specific integrated circuit (ASIC), and the module performs certain functions. The module is not meant to be limited to software or hardware entries. The module may be configured to be stored on an addressable storage medium, and configured to play one or more processors. The module may include entries such as software entries, object-oriented software entries, class entries, and task entries, and processes, functions, attributes, procedures, subroutines, segments of program code, drivers, firmware, microcode, circuitry, data, databases, data structures, tables, arrays, and variables, as will be appreciated by those skilled in the art. The functions provided in the entries and modules may be combined into a smaller number of entries and modules, or may be further separated into additional entries and modules. In addition, entries and modules may be implemented to reproduce one or more CPUs in the device.

Also, a computer-readable storage medium according to an embodiment of the present inventive concept may include computer code for one or more programs, wherein the computer program code may be programmed to cause the at least one processor to perform the method for acquiring capacitance of the capacitive touch panel described above.

According to embodiments of the inventive concept, a method of acquiring capacitance values for a capacitive touch panel is provided that us capable of minimizing LGM noise using multi-driving and a reference capacitance.

It can be understood by those skilled in the art that the inventive concept may be embodied in other specific forms without departing from the spirit or essential characteristics thereof. It can be therefore understood that the above-described embodiments may be illustrative in all aspects and not restrictive. It should be interpreted that the scope of the inventive concept may be defined by the appended claims rather than the detailed description, and all changes or modifications derived from the meaning and scope of the claims and the equivalents thereof may be included in the scope of the present inventive concept.

While example embodiments have been shown and described above, it will be apparent to those skilled in the art that modifications and variations could be made without departing from the scope of the inventive concept as defined by the appended claims.

What is claimed is:

1. A method of acquiring capacitance values for a capacitive touch panel, the method comprising:
    acquiring a selected capacitance value for a selected point from among a plurality of points respectively exhibiting a plurality of capacitances;
    determining the selected capacitance value as a reference capacitance value; and
    performing multi-driving using a balanced code to acquire a capacitance value from at least one point among the plurality of points using the reference capacitance value, wherein:
    the balanced code is a code excluding at least one row or at least one column having a non-zero sum of all entries in a Hadamard matrix,
    a sum of all entries included in the balanced code is zero, and
    the number of rows included in the balanced code is different from the number of columns included in the balanced code.

2. The method according to claim 1, wherein the performing of multi-driving comprises:
    applying the balanced code as an input signal to the capacitive touch panel to acquire an equation having a plurality of capacitance values as variables; and
    applying the reference capacitance value to the equation to acquire at least one capacitance value from among the plurality of capacitance values.

3. The method according to claim 1, wherein the selected point is determined based on generation of low ground mass (LGM) noise.

4. The method according to claim 1, wherein the selected capacitance value for the selected point is acquired by performing a single-driving.

5. The method according to claim 2, wherein an input line of the capacitive touch panel comprises a first input line to an Mth input line, and an output line of the capacitive touch panel comprises a first output line to an Nth output line, and the selected point is respectively associated with at least one line of the first output line to the Nth output line, where 'M' and 'N' are integers greater than 1.

6. The method according to claim 5, wherein the balanced code is a code excluding one of a first row and a first column in the Hadamard matrix having M rows and M columns.

7. The method according to claim 5, wherein the multi-driving comprises a first multi-driving performed by selecting P lines among the first input line to the Mth input line as a first group, wherein P is an integer greater than 1 and less than M.

8. The method according to claim 7, wherein the balanced code is a code excluding one of a first row and a first column in the Hadamard matrix having P rows and P columns.

9. The method according to claim 7, wherein the multi-driving further comprises a second multi-driving performed by selecting Q lines among the first input line to the Mth input line, except for the selected P lines, as a second group, wherein Q is an integer of 2 greater than 1 and less than (M-P).

10. The method according to claim 9, wherein one of capacitance values from at least one point acquired by performing the first multi-driving is again determined as the reference capacitance value, and a capacitance value from at least one point among the plurality of points belonging to the Q lines is acquired using the again determined reference capacitance value.

11. A capacitive touch panel including a first input line to an Mth input line as an input line for sensing a touch input, and a first output line to an Nth output line as an output line, the capacitive touch panel comprising:
    a reference capacitance setting unit configured to acquire a selected capacitance value at a selected point among a plurality of points respectively exhibiting a plurality of capacitances, and to determine the selected capacitance value as a reference capacitance value; and
    a multi-driving execution unit configured to perform multi-driving using a balanced code to acquire a capacitance value from at least one point among the plurality of points using the reference capacitance value, wherein:
    'M' and 'N' are integers greater than 1,
    the balanced code is a code excluding at least one row or at least one column having a non-zero sum of all entries in a Hadamard matrix,
    a sum of all entries included in the balanced code is zero, and
    the number of rows included in the balanced code is different from the number of columns included in the balanced code.

12. The capacitive touch panel according to claim 11, wherein the multi-driving execution unit performs multi-driving using the balanced code as an input signal to the capacitive touch panel to acquire an equation having a plurality of capacitance values as variables, and applies the reference capacitance value to the equation to acquire at least one capacitance value among the plurality of capacitance values.

13. The capacitive touch panel according to claim 11, wherein the reference capacitance setting unit determines the selected point based on generation of low ground mass (LGM) noise.

14. The capacitive touch panel according to claim 11, wherein the selected point is respectively associated with at least one line of the first output line to the Nth output line, and 'M' and 'N' are integers greater than 1.

15. The capacitive touch panel according to claim 14, wherein the multi-driving comprises a first multi-driving performed by selecting P lines among the first input line to the Mth input line as a first group, and the balanced code is a code excluding one of a first row and a first column in the Hadamard matrix having P rows and P columns, wherein P is an integer greater than 1 and less than M.

16. The capacitive touch panel according to claim 15, wherein the multi-driving further comprises a second multi-driving process performed by selecting Q lines among the first input line to the Mth input line, except for the selected P lines, as a second group, wherein Q is an integer greater than 1 and less than (M-P).

17. The capacitive touch panel according to claim 16, wherein one of capacitance values from at least one point acquired by performing the first multi-driving is again determined as the reference capacitance value, and a capacitance value from at least one point among the plurality of points belonging to the Q lines is acquired using the again determined reference capacitance value, when the second multi-driving is performed.

18. A method of acquiring capacitance values for a capacitive touch panel, the method comprising:

selecting a low ground mass (LGM) point exhibiting minimal LGM noise from among a plurality of points;

acquiring a LGM capacitance value for the LGM point and setting the LGM capacitance value as a reference capacitance value; and performing multi-driving to acquire a capacitance value from at least one point among the plurality of points using the reference capacitance value by applying a balanced code as an input signal to the capacitive touch panel to acquire an equation having a plurality of capacitance values as variables, and applying the reference capacitance value to the equation to acquire at least one capacitance value from among the plurality of capacitance values, wherein:

the balanced code is a code excluding at least one row or at least one column having a non-zero sum of entries in a Hadamard matrix, a sum of all entries included in the balanced code is zero, and the number of rows included in the balanced code is different from the number of columns included in the balanced code.

* * * * *